(12) United States Patent
Kobayashi et al.

(10) Patent No.: US 11,877,063 B2
(45) Date of Patent: Jan. 16, 2024

(54) INSPECTION DEVICE AND METHOD FOR CAPTURING INSPECTION IMAGE

(71) Applicant: FUJI CORPORATION, Chiryu (JP)

(72) Inventors: Takahiro Kobayashi, Chiryu (JP); Yuki Inaura, Chiryu (JP); Tomoya Fujimoto, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 17 days.

(21) Appl. No.: 17/627,548

(22) PCT Filed: Jul. 17, 2019

(86) PCT No.: PCT/JP2019/028160
§ 371 (c)(1),
(2) Date: Jan. 14, 2022

(87) PCT Pub. No.: WO2021/009884
PCT Pub. Date: Jan. 21, 2021

(65) Prior Publication Data
US 2022/0264019 A1 Aug. 18, 2022

(51) Int. Cl.
*H04N 23/695* (2023.01)
(52) U.S. Cl.
CPC ................... *H04N 23/695* (2023.01)
(58) Field of Classification Search
CPC ....... H04N 23/695; G01N 2021/95638; H05K 13/0815
See application file for complete search history.

(56) References Cited

U.S. PATENT DOCUMENTS

| 5,780,866 A | * | 7/1998 | Yamamura | G01N 21/956 250/559.22 |
| 2013/0100276 A1 | * | 4/2013 | Bishop | G01N 21/8806 348/87 |
| 2014/0071458 A1 | | 3/2014 | Nakatsukasa | |

FOREIGN PATENT DOCUMENTS

| JP | 2002-310628 A | | 10/2002 |
| JP | 2005086035 | * | 2/2005 |
| JP | 2015-145797 A | | 8/2015 |
| KR | 101497947 | * | 3/2015 |

OTHER PUBLICATIONS

International Search Report dated Sep. 10, 2019 in PCT/JP2019/028160 filed on Jul. 17, 2019, 2 pages.

* cited by examiner

*Primary Examiner* — Kathleen V Nguyen
(74) *Attorney, Agent, or Firm* — Oblon, McClelland, Maier & Neustadt, L.L.P.

(57) ABSTRACT

An inspection device that performs inspection by using an inspection image of a board on which multiple components are disposed, the inspection device includes a fixed focus type camera, a lifting/lowering mechanism configured to move the camera up or down relative to the board, a setting section configured to acquire height information of the components, and set a reference position separated from a top surface of the board by a distance corresponding to a height of each of the components according to a predetermined setting method such that an imaging surface of each component within an imaging range of the camera is included in a depth of field of the camera, and a control section configured to control the lifting/lowering mechanism and the camera such that the inspection image is captured after the camera is relatively moved up or down to focus on the reference position.

6 Claims, 8 Drawing Sheets

INSPECTION DEVICE AND METHOD FOR CAPTURING INSPECTION IMAGE

TECHNICAL FIELD

The present specification discloses an inspection device and a method for capturing an inspection image.

BACKGROUND ART

In the conventional art, an inspection device that inspects a mounting state of a component mounted on a board by using an inspection image has been proposed (refer to Patent Literature 1, for example). This inspection device configured to be capable of vertically moving a fixed focus type camera of which a focal length is fixed to a certain distance. The inspection device extracts a height (thickness) of each of components mounted on the board, sets a target height position of the camera, and captures an inspection image by vertically moving the camera to the height position to be brought into focus.

PATENT LITERATURE

Patent Literature 1: JP-A-2002-310628

BRIEF SUMMARY

Technical Problem

In the above-described inspection device, since the camera is vertically moved to adjust the height position in accordance with a height of each of the components mounted on the board, the number of height position adjustments is increased. Thus, it takes time to capture the inspection image, and thus it is difficult to perform prompt inspection.

A principal object of the present disclosure is to enable prompt inspection by quickly capturing inspection images of multiple components mounted on a board with a fixed focus type camera.

Solution to Problem

The present disclosure has employed the following means in order to achieve the principal object described above.

According to the present disclosure, there is provided an inspection device that performs inspection by using an inspection image of a board on which multiple components are disposed, the inspection device including a fixed focus type camera; a lifting/lowering mechanism configured to move the camera up and down relative to the board; a setting section configured to acquire height information of the components, and set a reference position separated from a top surface of the board by a distance corresponding to a height of each of the components according to a predetermined setting method such that an imaging surface of each component within an imaging range of the camera is included in a depth of field of the camera; and a control section configured to control the lifting/lowering mechanism and the camera such that the inspection image is captured after the camera is relatively moved up or down to focus on the reference position.

The inspection device of the present disclosure sets a reference position separated from the top surface of the board by a distance corresponding to the height of each component according to a predetermined setting method such that an imaging surface of each component within an imaging range of the camera is included in the depth of field of the camera. The camera is moved up and down relative to the board to focus on the reference position, and then captures the inspection image. As a result, since the imaging surface of each component within the imaging range of the camera can be captured in a single inspection image, the inspection image can be quickly captured compared with a case where the camera is moved up and down to focus on the imaging surface of each component and captures the inspection image of each component. Therefore, it is possible to perform prompt inspection by quickly capturing inspection images of multiple components mounted on the board with the fixed focus type camera.

DESCRIPTION OF EMBODIMENTS

Figure 1:
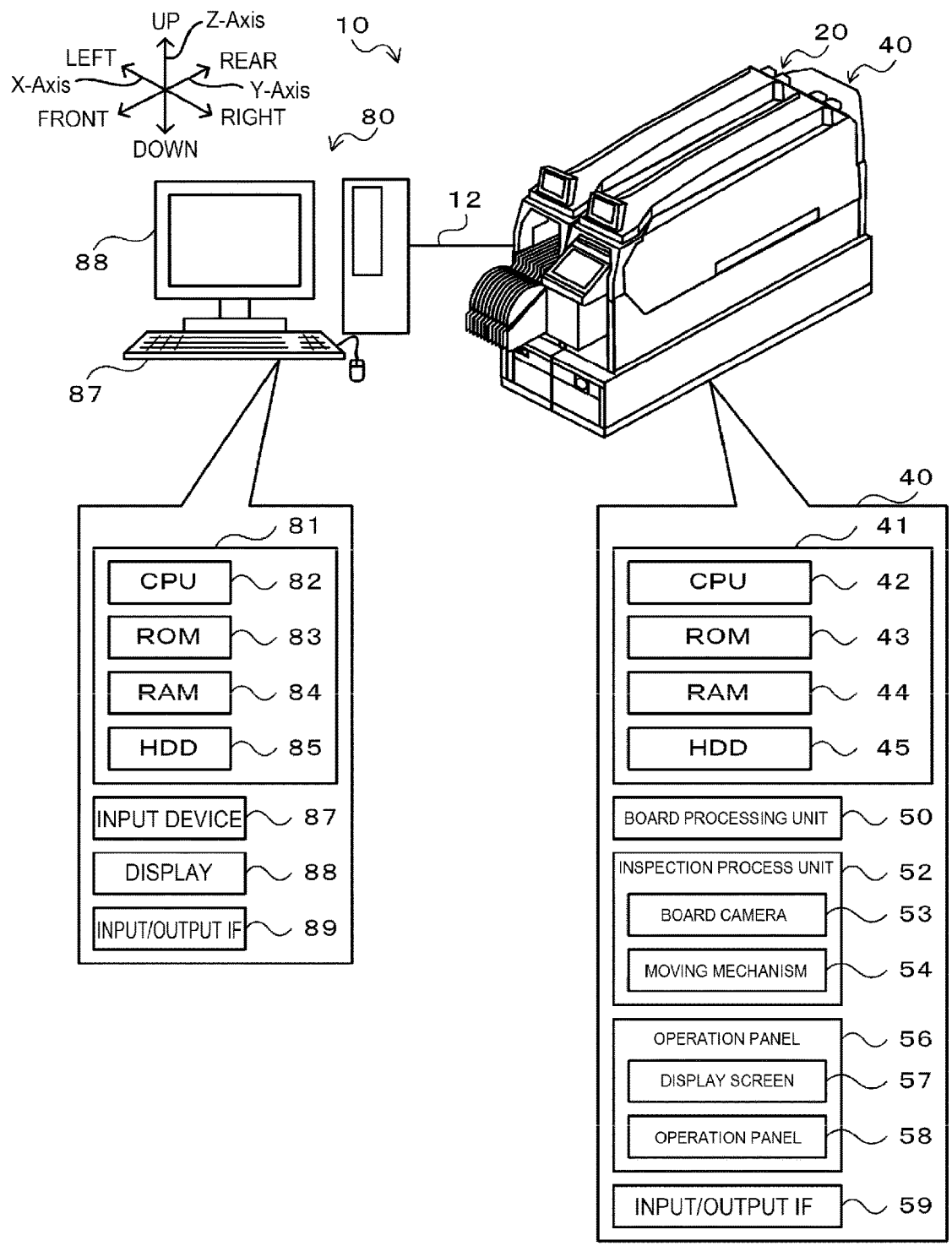
FIG. 1 is an explanatory diagram illustrating an example of component mounting system 10.
Figure 2:
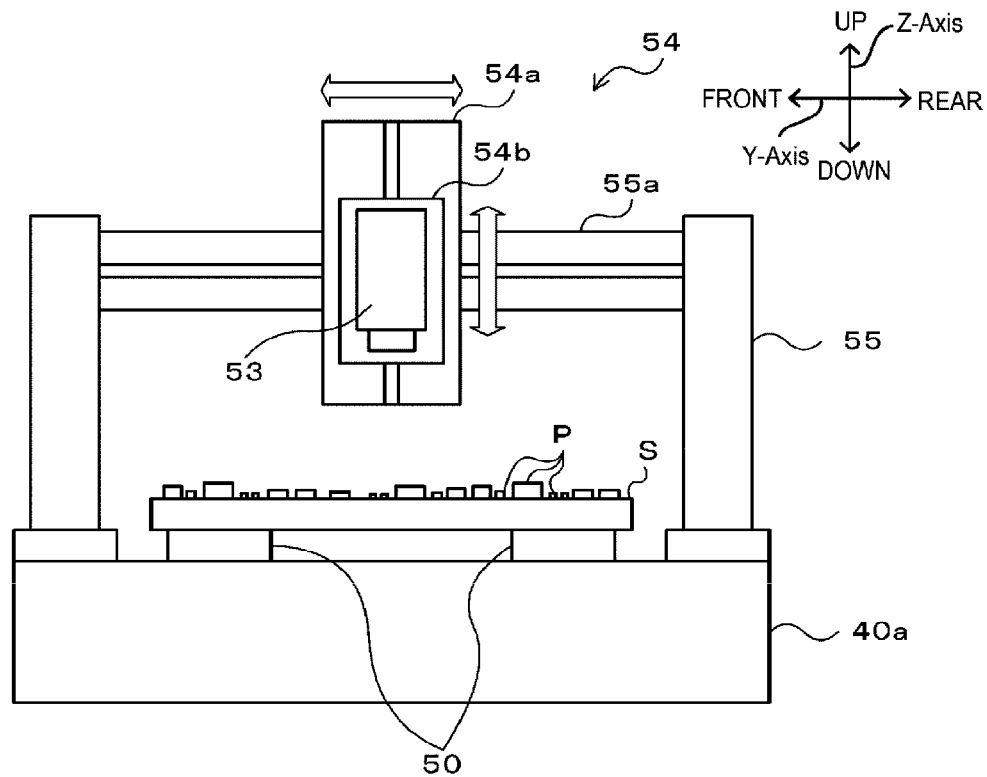
FIG. 2 is an explanatory diagram schematically illustrating configurations of board camera 53 and moving mechanism 54 of inspection device 40.

Next, embodiments of the present disclosure will be described with reference to the drawings. FIG. 1 is an explanatory diagram illustrating an example of component mounting system 10, and FIG. 2 is an explanatory diagram illustrating an outline of configurations of board camera 53 and moving mechanism 54 of inspection device 40.

As illustrated in FIG. 1, component mounting system 10 includes a mounting device 20 that picks up component P from a reel, a tray, or the like and mounts component P on board S, inspection device 40 that inspects board S on which multiple components P are mounted, and management device 80 that manages information related to mounting device 20 and inspection device 40. Mounting device 20, inspection device 40, and management device 80 are connected to LAN 12 serving as a network, and can exchange information with each other.

Although one mounting device 20 and one inspection device 40 are illustrated in FIG. 1, multiple mounting devices 20 or multiple inspection devices 40 may be provided. In the present embodiment, a left-right direction (X-axis), a front-rear direction (Y-axis), and an up-down direction (Z-axis) are as illustrated in FIG. 1. The term "mounting" includes disposing, attaching, inserting, bonding, adhering, and the like component P on board S.

Inspection device 40 includes inspection control unit 41 that executes various types of control, board processing unit 50 that executes conveyance and fixing in the X direction of board S on which component P is mounted, and inspection process unit 52 that executes a process of capturing an inspection image or the like during inspection of board S. Inspection device 40 includes operation panel 56 capable of displaying various information and receiving various input operations performed by an operator, and input/output interface (I/F) 59 for performing communication.

Inspection process unit 52 includes board camera 53 that captures an inspection image including a board ID on board S or multiple components P disposed on board S, and moving mechanism 54 that moves board camera 53 in the Y direction and the Z direction. Board camera 53 is configured as a fixed focus type camera having a fixed focal length of an optical system, and although not illustrated, includes a lighting section that irradiates board S with light, an imaging element that outputs electric charge generated by light reception, and an image processing section that generates image data based on the output electric charge. As illustrated in FIG. 2, gate-type frame 55 disposed to straddle board S conveyed by board processing unit 50 is fixed to base 40a of inspection device 40. Moving mechanism 54 includes Y-direction slider 54a movably attached to beam 55a of frame 55 in the Y direction, and Z-direction slider 54b movably attached to Y-direction slider 54a in the Z direction. Board camera 53 is fixed to the Z-direction slider 54b, and thus board camera 53 is moved in the Y-direction or moved (up and down) in the Z-direction in accordance with the movement of Y-direction slider 54a or the movement of Z-direction slider 54b. Each slider is driven by a drive motor. Board S is moved in the X direction by board processing unit 50, and is fixed such that a predetermined range thereof in the X direction is located below board camera 53. Inspection process unit 52 captures an inspection image with board camera 53 after moving mechanism 54 moves board camera 53 in the Y direction to adjust an imaging range and moves board camera 53 to a height position in the Z direction corresponding to the fixed focal length to be brought into focus in a state in which board S is fixed. Board camera 53 can capture an inspection image without blurring not only for component P of which an upper surface (imaging surface) is located at a focal length at which board camera 53 is accurately focused but also for component P of which the upper surface is located within the depth of field that appears to be in focus.

Operation panel 56 includes display screen 57 that displays various information, and operation button 58 that receives an input operation of an operator. Display screen 57 is configured as a liquid crystal display, and displays inspection information, setting information, images, and the like of inspection device 40. Operation button 58 includes a cursor button for moving a selection cursor in display screen 57 in the up-down direction and the left-right direction, a determination button for determining the selection content, a cancel button for cancelling the input, and the like.

Inspection control unit 41 is configured as a microprocessor centered on CPU 42, and includes ROM 43 that stores processing programs, RAM 44 that is used as a work region, HDD 45 that stores various data, and the like, which are connected via a bus. Inspection control unit 41 outputs control signals to board processing unit 50 or moving mechanism 54 of inspection process unit 52, outputs imaging signals to board camera 53 of inspection process unit 52, outputs display signals to operation panel 56, or transmits information to management device 80, via input/output interface 59. Inspection control unit 41 receives signals from board processing unit 50, acquires inspection images captured by board camera 53, receives operation signals from operation panel 56, or receives information from management device 80, via input/output interface 59.

Figure 3:
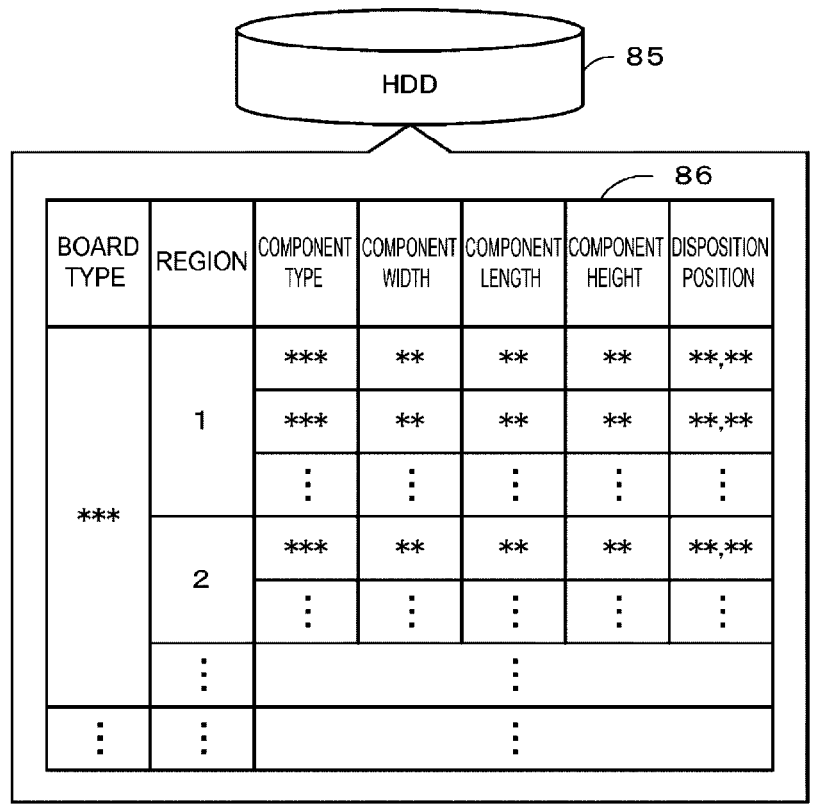
FIG. 3 is an explanatory diagram illustrating an example of mounting schedule information 86.
Figure 4:
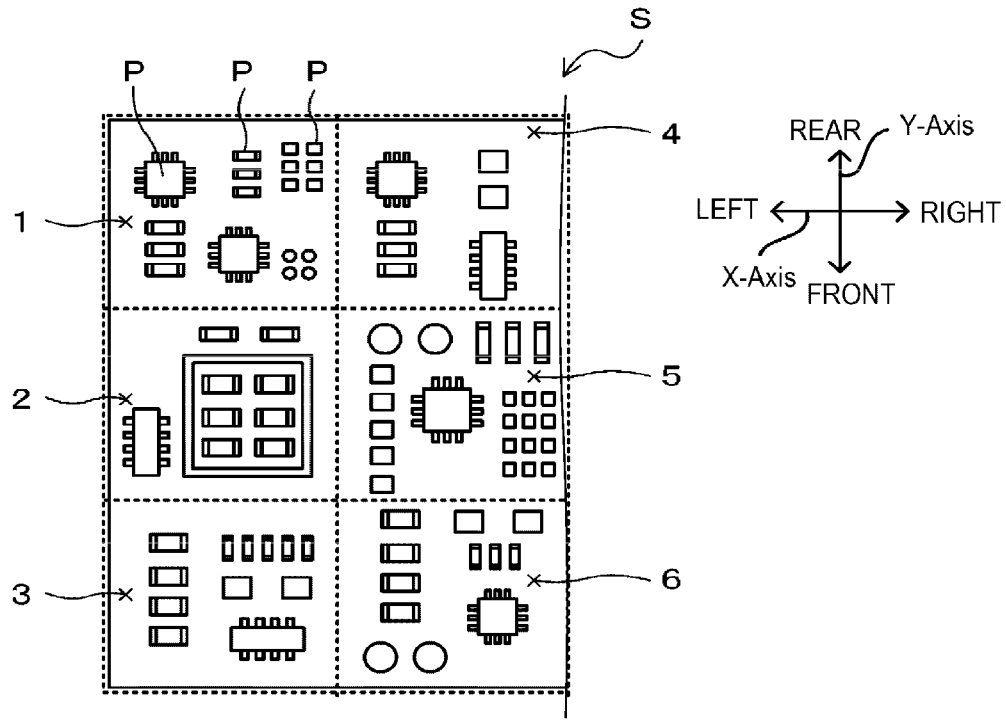
FIG. 4 is an explanatory diagram illustrating an example in which board S is divided into multiple regions.

Management device 80 includes control device 81, and manages mounting device 20 and inspection device 40. Control device 81 is configured as a microprocessor centered on CPU 82, and includes ROM 83 that stores processing programs, RAM 84 that is used as a work region, HDD 85 that stores various data, and the like, which are connected via a bus. Management device 80 includes input device 87 such as a keyboard and a mouse used for an operator to input various instructions, display 88 that displays various information, and input/output interface (I/F) 89 for performing communication. HDD 85 stores various information used for mounting in mounting device 20 and inspection in inspection device 40. FIG. 3 is an explanatory diagram illustrating an example of mounting schedule information 86. Mounting schedule information 86 includes, for example, information related to a production schedule job, such as numbers of multiple regions into which board S is divided, the component type of component P, a size such as a width in the X-direction, a length in the Y-direction, and a height in the Z-direction, and a disposition position of component P, in correlation with the board type of board S. The information of the disposition position is, for example, information indicating XY coordinates of the center of component P. The regions in board S are multiple regions into which board S is divided based on an imaging range of board camera 53 of inspection device 40. FIG. 4 is an explanatory diagram illustrating an example in which board S is divided into multiple regions. As illustrated, multiple regions (regions 1 to 6 in FIG. 4) are obtained by dividing the inside of board S vertically and horizontally. In a case where board S is a multiple pattern board having multiple child boards, each child board may be used as one region or the like, or each child board may be further divided into multiple regions.

Figure 5:
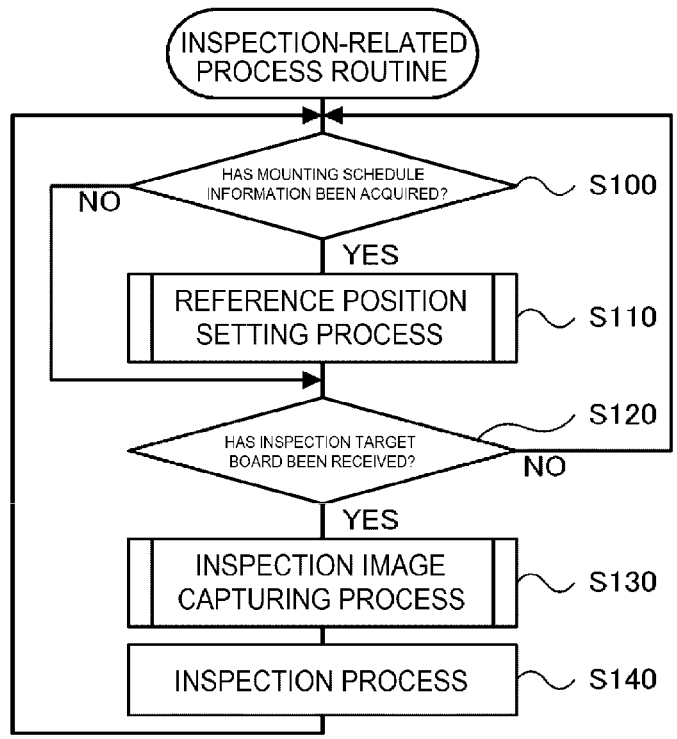
FIG. 5 is a flowchart illustrating an example of an inspection-related process routine.

In the following description, an operation of inspection device 40, particularly an operation related to inspection of board S on which multiple components P are mounted will be described. FIG. 5 is a flowchart illustrating an example of an inspection-related process routine. This routine is stored in HDD 45 of inspection control unit 41 and executed by CPU 42. When this routine is executed, first, CPU 42 determines whether the mounting schedule information has been acquired (S100). It is assumed that the mounting schedule information is transmitted from management device 80 to inspection device 40 at a predetermined timing, for example, when a job production schedule is created. When it is determined that the mounting schedule information has been acquired, CPU 42 executes a reference position setting process of setting reference position Fc that is a reference of a height of board camera 53 at the time of capturing an image (S110).

Figure 6:
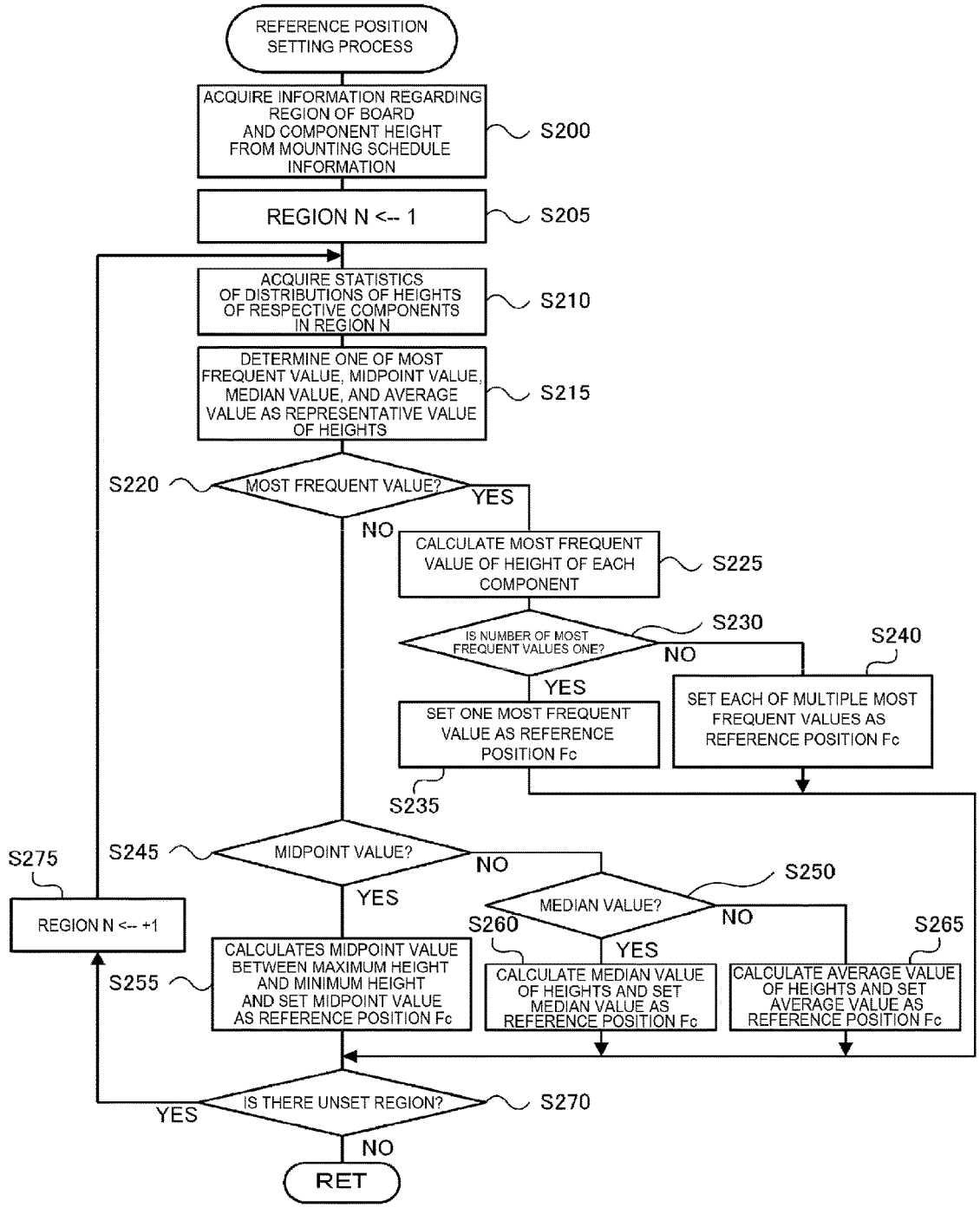
FIG. 6 is a flowchart illustrating an example of a reference position setting process.

FIG. 6 is a flowchart illustrating an example of the reference position setting process. In the reference position setting process, first, CPU 42 acquires information regarding regions into which board S is divided and information regarding a height of component P scheduled to be mounted from the mounting schedule information (S200), and sets the value of 1 in region N that is a processing target (S205). Next, CPU 42 acquires statistics of distributions such as a histogram of heights of respective components P disposed in region N from the information acquired in S200 (S210), and determines any of a most frequent value, a midpoint value, a median value, and an average value as a representative value of the heights of respective components P based on the result (S215). In S215, CPU 42 determines a representative value in accordance with the number of components P that is the number of pieces of data for which statistics are acquired, or determines a representative value in accordance with the number of components P that are outliners in a height distribution, the importance of the inspection of component P, or the required inspection accuracy. For example, CPU 42 determines a most frequent value in a case where the number of pieces of data is equal to or larger than a predetermined number, and determines a value other than the most frequent value in a case where the number of pieces of data is smaller than the predetermined number, that is, determines the most frequent value in a case where the number of pieces of data is relatively large. CPU 42 determines a median value in a case where the influence of an outlier is desired to be removed from the importance of the inspection of component P, and determines a midpoint value between the maximum height and the minimum height in a case where the influence of the outlier is desired to be increased. In a case where the influence of the outlier is small or there is no problem even when the outlier is included according to the number of components P that are outliers, CPU 42 determines an average value.

When the representative value is determined as described above, CPU 42 determines whether the most frequent value has been determined as a representative value (S220), and when it is determined that the most frequent value has been determined, calculates a most frequent value of the height of each component P in region N (S225). Subsequently, CPU 42 determines whether the number of the calculated most frequent values is one (S230), and when the number of the most frequent values is one, sets the most frequent value of one to reference position Fc (S235), and when the number of the most frequent values is not one but plural, sets each of the multiple most frequent values to reference position Fc (S240). Although the most frequent values are plural depending on the tendency of the height distribution, CPU 42 may determine the most frequent values to be plural up to a predetermined number (for example, two or three), and may determine a midpoint value, a median value, or an average value other than the most frequent value when the most frequent value is equal to or more than a predetermined number.

When it is determined that the most frequent value has not been determined as a representative value in S220, CPU 42 determines whether the midpoint value has been determined (S245) and whether the median value has been determined (S250). When it is determined that the midpoint value has been determined, CPU 42 calculates the midpoint value from the maximum height and the minimum height of respective components P in region N, and sets the midpoint value as reference position Fc (S255). When it is determined that the median value has been determined in S250, CPU 42 calculates the median value of the heights of respective components P in region N and sets the median value as reference position Fc (S260). When it is determined that, instead of the midpoint value or the median value in S245 or S250, that is, the average value has been determined, CPU 42 calculates the average value of the heights of the respective components P in region N and sets the average value as reference position Fc (S265).

Figure 7:
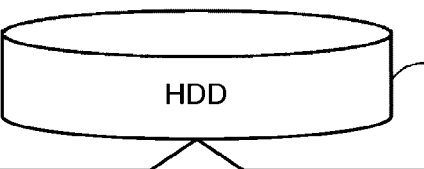
FIG. 7 is an explanatory diagram illustrating a representative value and reference position Fc for each region of a board type.

When reference position Fc is set as described above, CPU 42 determines whether there is a region for which reference position Fc has not been set (S270). When it is determined that there is an unset region, CPU 42 increments region N by the value of 1 (S275), returns to S210 and performs the process, and finishes the reference position setting process when it is determined that there is no unset region. As a result of the execution of the reference position setting process, as illustrated in FIG. 7, reference position Fc is set by using any of the most frequent value, the midpoint value, the median value, and the average value as a representative value of the heights of respective components P for each region in board S of each board type, and is stored in HDD 45. In FIG. 7, since there are multiple most frequent values (here, two) in region 5, two reference positions Fc are set.

When it is determined that the reference position setting process in S110 is executed or the mounting schedule information is not acquired in S100, CPU 42 determines whether board S that is an inspection target conveyed from mounting device 20 has been received (S120), and returns to S100 when it is determined that board S has not been received. On the other hand, when it is determined that board S has been received, CPU 42 executes an inspection image capturing process (S130), executes an inspection process using the inspection image (S140), and returns to S100.

Figure 8:
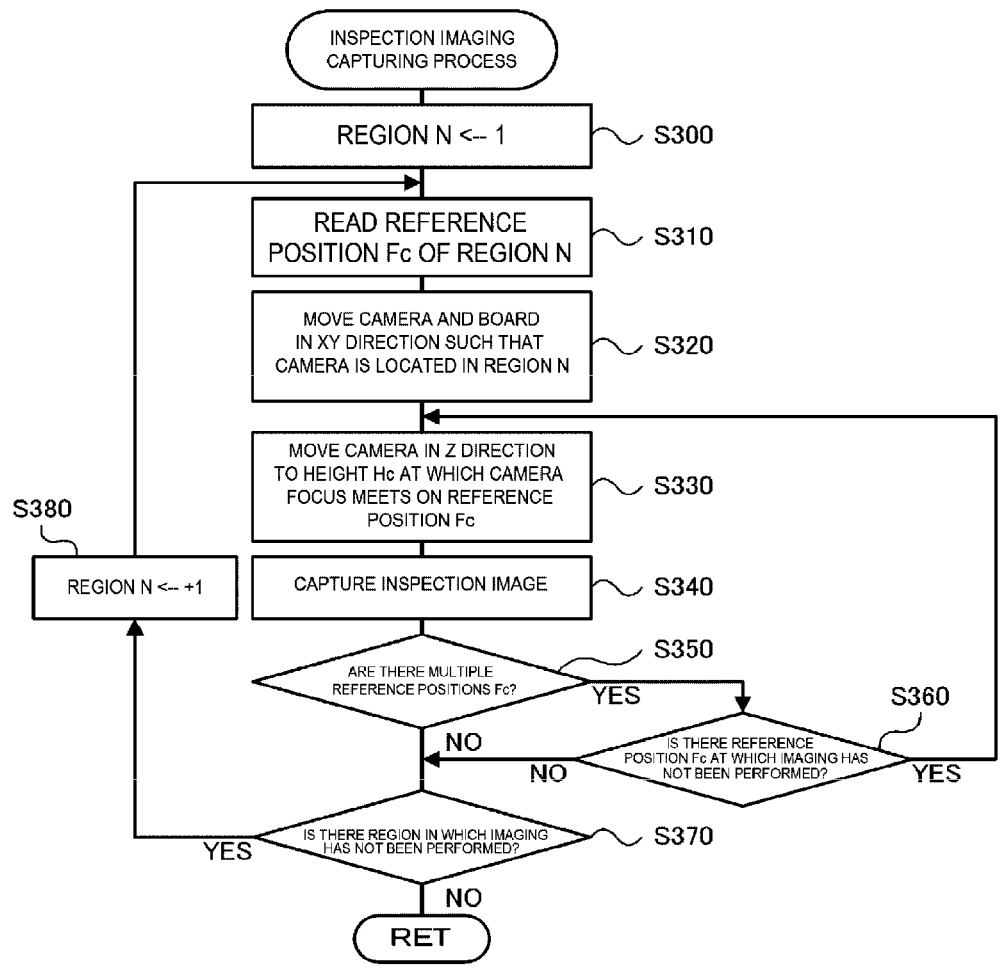
FIG. 8 is a flowchart illustrating an example of an inspection image capturing process.

FIG. 8 is a flowchart illustrating an example of the inspection image capturing process. In the inspection image capturing process, first, CPU 42 sets the value of 1 in region N (S300), and reads reference position Fc of region N among the reference positions Fc of the board types of the received board S from HDD 45 (S310). Next, CPU 42 moves board camera 53 and board S in the XY-directions such that board camera 53 is located in region N (S320). In S320, CPU 42 sets region N as an imaging region, and drives Y-direction slider 54a of moving mechanism 54 such that board camera 53 is moved above region N. When necessary, CPU 42 controls board processing unit 50 such that board S is moved in the X direction and fixed. Next, CPU 42 controls moving mechanism 54 such that board camera 53 is moved (up and down) in the Z direction to height Hc at which board camera 53 focus on reference position Fc read in S310 (S330). That is, CPU 42 drives Z-direction slider 54b of moving mechanism 54 such that board camera 53 is moved up or down to the height Hc.

Next, CPU 42 captures an inspection image with board camera 53 (S340), and determines whether there are multiple reference positions Fc of region N this time (S350). For example, when it is determined that there are multiple reference positions Fc, such as in the case of region 5 in FIG. 7, CPU 42 determines whether there is reference position Fc at which imaging has not been performed (S360), and when it is determined that there is reference position Fc at which imaging has not been performed, returns to S330 and performs the process. Thus, since the inspection image is captured at height Hc corresponding to each reference position Fc, multiple inspection images are captured in one region. When it is determined in S350 that there are no multiple reference positions Fc, or when it is determined in S360 that there is no reference position Fc at which imaging has not been performed, CPU 42 determines whether there is a region in which imaging has not been performed (S370). When it is determined that there is a region in which imaging has not been performed, CPU 42 increments region N by the value of 1 (S380), returns to S310 and performs the process, and finishes the inspection image capturing process when it is determined that there is no region in which imaging has not been performed. As a result of the execution of the inspection image capturing process, an inspection image is captured in each region of board S, and multiple inspection images are captured in a region where multiple reference positions Fc are set. In a case where multiple inspection images are captured in one region, component P is inspected by using each inspection image in the inspection process. In this case, since CPU 42 can ascertain height Hc at which component P is captured in an inspection image that is captured in a state without blurring in accordance with a height of each component P, and can thus accurately perform the inspection by using an inspection image suitable for each component P.

Figure 9:
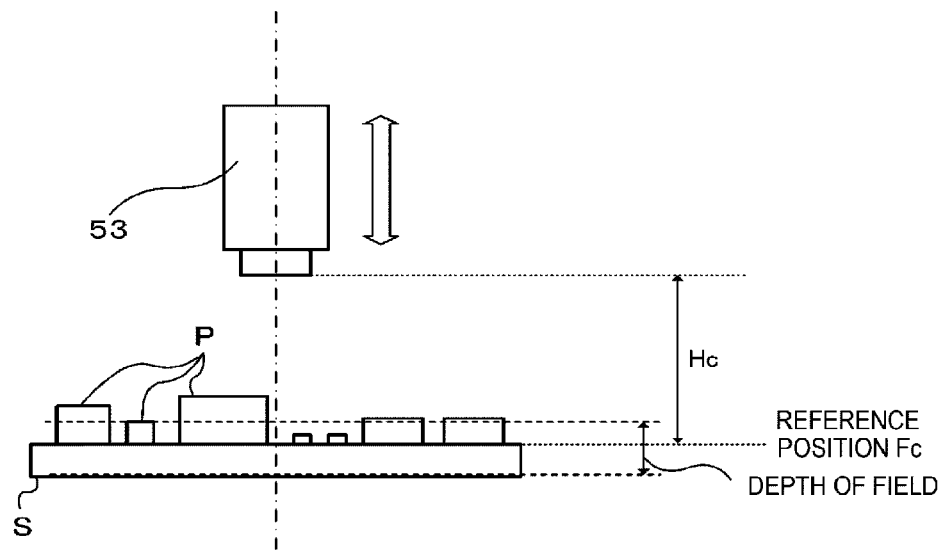
FIG. 9 is an explanatory diagram illustrating reference position Fc of a comparative example.
Figure 10:
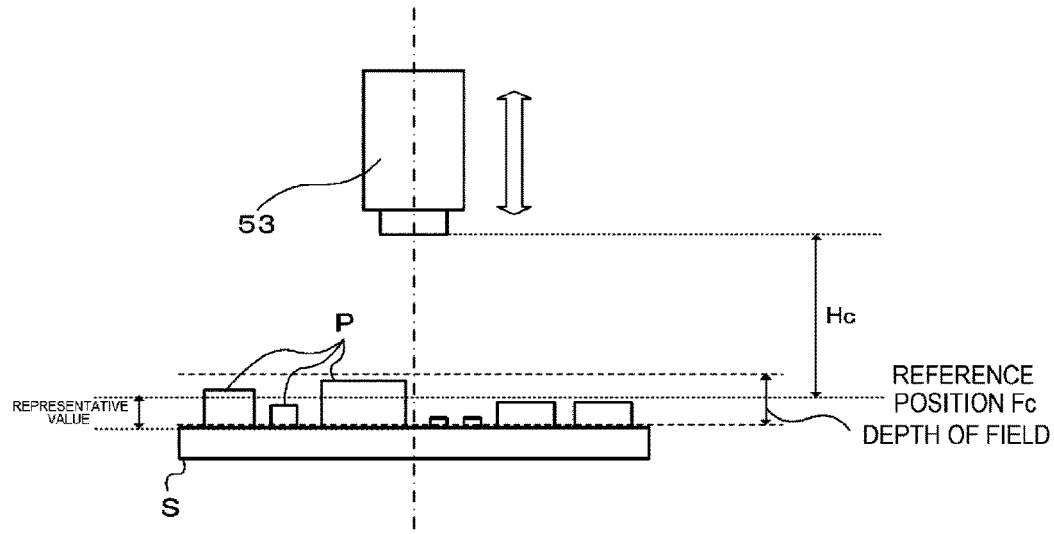
FIG. 10 is an explanatory diagram illustrating reference position Fc of the present embodiment.

Here, FIG. 9 is an explanatory diagram illustrating reference position Fc of a comparative example, and FIG. 10 is an explanatory diagram illustrating reference position Fc of the present embodiment. In the comparative example illustrated in FIG. 9, reference position Fc is set on the upper surface of board S, whereas in the present embodiment illustrated in FIG. 10, a representative value such as an average value of the heights of components P is set as reference position Fc. In the comparative example, since reference position Fc is set on the upper surface of board S, an upper surface that is an imaging surface of any component P may deviate from the depth of field. In this case, there is concern that an inspection image in a state in which the upper surface of each component P is blurred may be captured to reduce the inspection accuracy. In contrast, in the present embodiment, since reference position Fc corresponding to a height of each component P is set instead of the upper surface of board S, and board camera 53 is moved up or down to height Hc based on reference position Fc, as illustrated in FIG. 10, it is possible to capture inspection images in a state in which upper surfaces of multiple components P are included in the depth of field. Therefore, since the upper surface of each component P can be captured in an inspection image in a state without blurring, the inspection accuracy can be improved. Since it is not necessary to repeatedly capture an inspection image at height Hc corresponding to each of the heights of multiple components P in order to focus on each of the upper surfaces of multiple components P, it is possible to prevent an increase in the inspection time due to much time required to capture an inspection image.

Here, a correspondence relationship between components of the present embodiment and components of the present disclosure will be clarified. Inspection device 40 of the present embodiment corresponds to an inspection device of the present disclosure, board camera 53 corresponds to a camera, moving mechanism 54 (Z-direction slider 54b) corresponds to a lifting/lowering mechanism, CPU 42 of inspection control unit 41 that performs the reference position setting process in S110 of the inspection-related process routine corresponds to a setting section, and CPU 42 of inspection control unit 41 that performs the inspection image capturing process in S130 of the inspection-related process routine corresponds to a control section. In the present embodiment, an example of an inspection image capturing method according to the present disclosure is also clarified by describing the operation of inspection device 40.

In inspection device 40 described above, reference position Fc is set based on a representative value of the heights of respective components P such that the upper surface of each component P is included in the depth of field of fixed focus type board camera 53, board camera 53 is moved up or down to height Hc at which the focus is adjusted to reference position Fc, and then an inspection image is captured. Consequently, it is possible to quickly capture, with board camera 53, inspection images of multiple components P mounted on board S and thus to perform prompt inspection. Since the upper surface of each component P can be imaged in a state as little blurring as possible, the inspection accuracy can be improved.

Reference position Fc can be quickly set according to a simple setting method using any of a most frequent value, a midpoint value, a median value, and an average value as a representative value of the heights of respective components P. Since multiple reference positions Fc are set by using each of multiple most frequent values, it is possible to more appropriately capture the upper surface of each component P in an inspection image to improve the inspection accuracy by setting appropriate reference position Fc corresponding to each most frequent value. Since one board S is divided into multiple regions and reference position Fc is set for each region according to a separate setting method, even in a case where the tendency of the height of component P differs for each region, it is possible to set appropriate reference position Fc to improve the inspection accuracy.

The present disclosure is not limited to the above-described embodiment, and may be implemented in various aspects without departing from the technical scope of the present disclosure.

Figure 11:
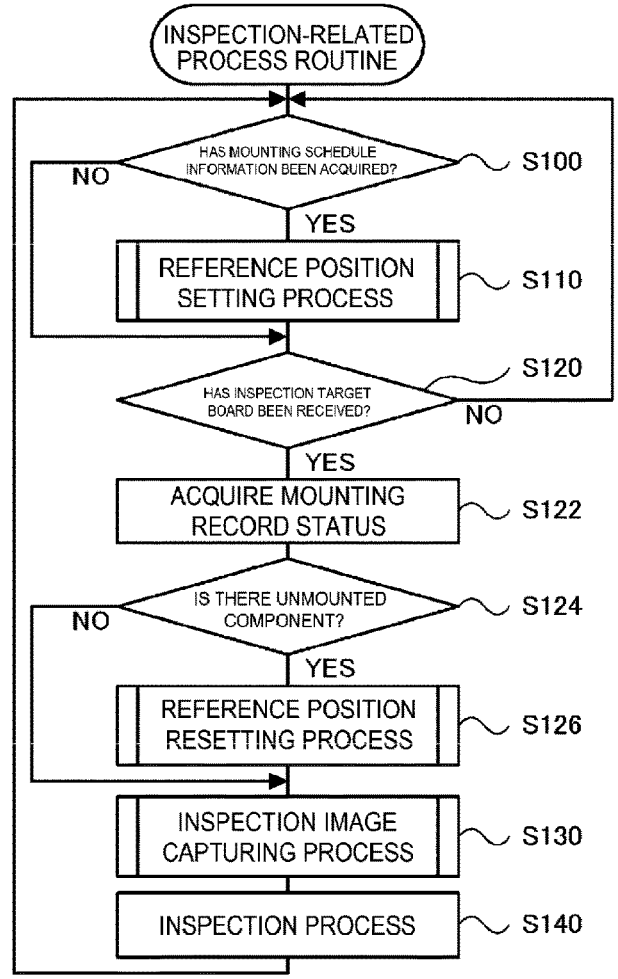
FIG. 11 is a flowchart illustrating an inspection-related process routine according to a modification example.

For example, in the above embodiment, an inspection image is captured by using reference position Fc set in advance when the mounting schedule information is acquired; however, the configuration is not limited to this. FIG. 11 is a flowchart illustrating an inspection-related process routine according to a modification example. In the modification example, the same process as in the above embodiment is given the same step number, and detailed descriptions thereof will be omitted. In the inspection-related process routine of the modification example, when it is determined that board S that is an inspection target is received in S120, CPU 42 acquires mounting record information of board S from management device 80 (S122). Every time the mounting process for one board S is completed, mounting device 20 transmits a board ID (identification information) of board S and a mounting status of component P on board S to management device 80. When there is component P that cannot be mounted on board S as scheduled due to an error or the like, that is, when there is unmounted component P, mounting device 20 transmits information such as the component type or a disposition position of component P to management device 80. Management device 80 stores the information in HDD 85 as the mounting record information in correlation with the board ID of board S. When the mounting record information is acquired in S122, CPU 42 determines whether there is unmounted component P on received board S (S124). When it is determined that there is unmounted component P, CPU 42 executes a reference position resetting process in FIG. 12 (S126), then the proceeds to a process in S130, whereas when it is determined that there is no unmounted component P, skips S126 and proceeds to the process in S130.

Figure 12:
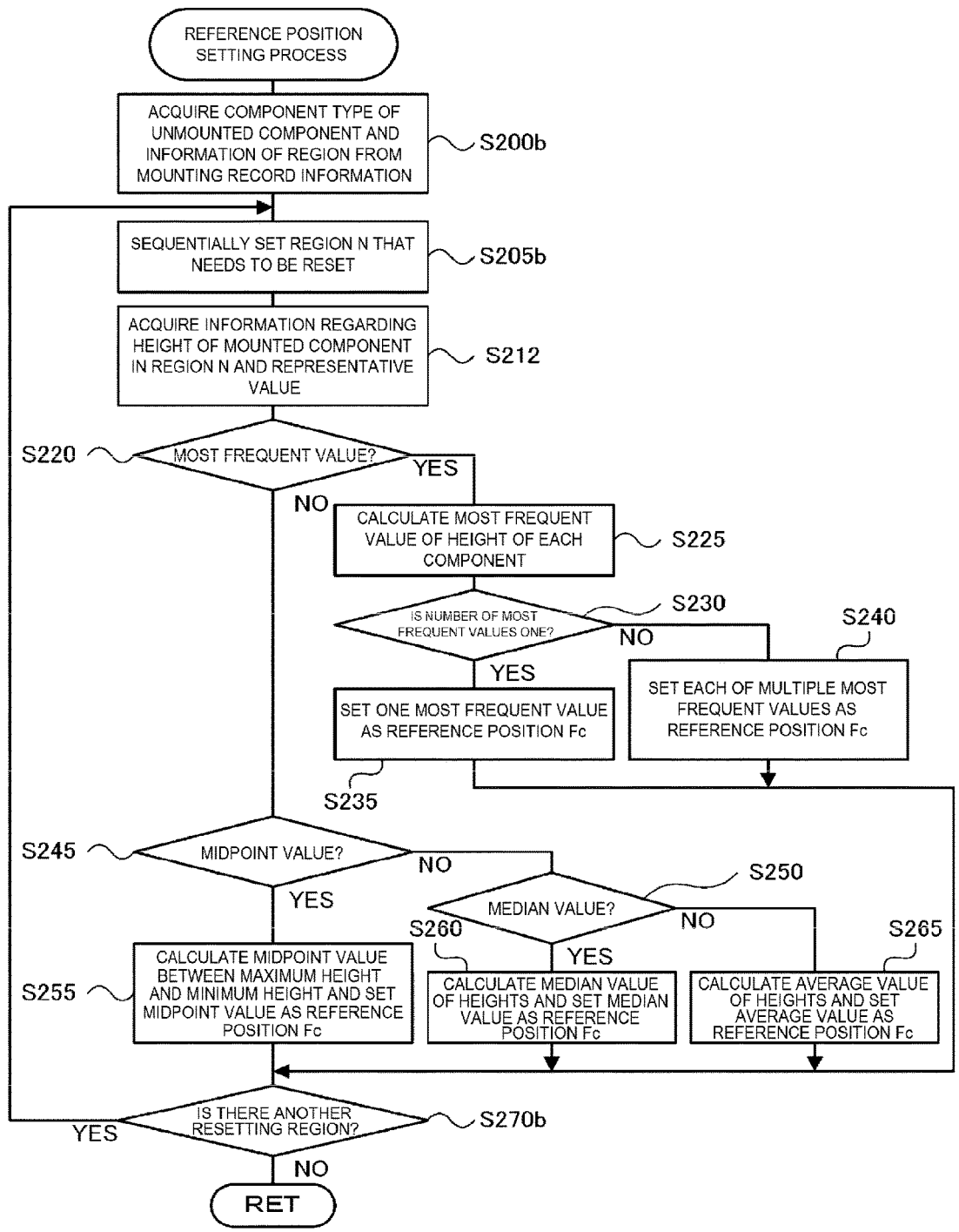
FIG. 12 is a flowchart illustrating an example of a reference position resetting process.

In the reference position resetting process in FIG. 12 (S126), first, CPU 42 acquires, from the mounting record information, the component type of unmounted component P and information of a region including a disposition position thereof (S200b). In the reference position resetting process, CPU 42 resets reference position Fc of the region acquired in S200b. Therefore, CPU 42 sets the acquired region in order to region N that needs to be reset (S205b), acquires information regarding heights of other components P other than unmounted component P in region N, that is, each component P that has been mounted, and acquires information regarding whether a representative value in region N is any of a most frequent value, a midpoint value, a median value, and an average value (S212). CPU 42 resets reference position Fc by performing the processes in S220 to S265 by using the heights of the mounted components P other than unmounted component P. Subsequently, CPU 42 determines whether there is another resetting region (S270b), and when it is determined that there is another resetting region, returns to S205b and performs the process, whereas when it is determined that there is no other resetting region, finishes the reference position resetting process. As described above, in the modification example, in a case where there is component P that has not been mounted, appropriate reference position Fc is reset based on heights of mounted components P other than that component P. Thus, since an inspection image more suitable for an actual mounting status of component P can be captured, it is possible to improve the inspection accuracy. In this modification example, statistics of distributions of heights of mounted components P other than unmounted components P in region N may be recalculated, any of a most frequent value, a midpoint value, a median value, and an average value may be determined as a representative value based on the result, and then reference position Fc may be reset. As a result, it is possible to reset reference position Fc more suitable for the tendency of a height of each component P that has been mounted except for unmounted component P.

In the above embodiment, different reference positions Fc can be set in each region of board S; however, the configuration is not limited to this, and one reference position Fc may be set for board S, for example, by setting common reference position Fc in each region of board S. Multiple reference positions Fc are set in a case where there are multiple most frequent values; however, the configuration is not limited to this. For example, any one of most frequent values may be set as reference position Fc in accordance with the importance or the like of inspection of multiple types of components P corresponding to the most frequent values. Alternatively, if the multiple most frequent values are relatively close to each other, any one of the most frequent values may be set as reference position Fc, or an average of the multiple most frequent values may be set as reference position Fc.

In the above embodiment, reference position Fc is set by using any of a most frequent value, a midpoint value, a median value, and an average value of heights of respective components P; however, the configuration is not limited to this, and reference position Fc may be set by using a representative value of the heights of the respective components P. For example, there is no limitation to the configuration in which a representative value is determined from four values such as the most frequent value, the midpoint value, the median value, and the average value, the representative value may be determined from any two or three thereof, or the representative value may be determined according to another method using a weighted average value or the like, in which a height of component P having a relatively high importance of inspection is weighted. Alternatively, there is no limitation to the configuration in which a representative value is determined according to multiple methods, the representative value may be determined according to a method for which an instruction is given by an operator, or may be determined according to a predefined method. There is no limitation to the configuration in which reference position Fc is set by using a representative value of heights as long as it is set to a distance separated from the upper surface of board S by a distance corresponding to a height of each component P, and the distance may be determined according to any method. For example, the depth of field differs between the front depth of field ahead of a position where the accurate focus is obtained (board camera 53 side) and the rear depth of field, and normally the rear depth of field is about twice the front depth of field. Thus, a value obtained by adding a predetermined value to a representative value of the heights of respective components P may be set as reference position Fc in consideration of a ratio of the depth of field of board camera 53 to the front depth of field and the rear depth of field. As a result, it is possible to set reference position Fc at which the upper surface of each component P can be more easily included in the depth of field.

In the above embodiment, component P disposed on the upper surface of board S is inspected; however, the configuration is not limited to this, and component P disposed on the lower surface of board S may be inspected. That is, reference position Fc separated from the top surface (disposition surface) of board S by a distance corresponding to the height of each component P may be set such that an imaging surface of each component is included in the depth of field of board camera 53.

In the above embodiment, inspection device 40 sets reference position Fc; however, the configuration is not limited to this, and management device 80 may set reference position Fc and transmit set reference position Fc to inspection device 40. Mounting device 20 may include a fixed focus type camera and a lifting/lowering mechanism moving the camera up and down in at least the Z direction, and may have a function of performing inspection by using an image captured by the camera, that is, mounting device 20 may also serve as an inspection device. In such a case, mounting device 20 may set reference position Fc.

Here, the inspection device of the present disclosure may be configured as follows. In the inspection device of the present disclosure, the setting section may use, as the predetermined setting method, any of a method of setting the reference position with an average value of the heights of the respective components as the distance, a method of setting the reference position with a median value of the heights of the respective components as the distance, a method of setting the reference position with a midpoint value of the heights of the respective components as the distance, and a method of setting the reference position with a most frequent value of the heights of the respective components as the distance. With this configuration it is possible to quickly set a reference position separated by a distance corresponding to the height of each component according to a relatively simple setting method.

In the inspection device of the present disclosure, in a case where there are multiple most frequent values when using the method of setting the reference position by using the most frequent value as the predetermined setting method, the setting section may set multiple reference positions by using each of the multiple most frequent values, and the control section may control the lifting/lowering mechanism and the camera such that the inspection image is captured at each of the multiple reference positions. With this configuration, in a case where multiple most frequent values are calculated, an appropriate reference position corresponding to each of the most frequent values can be set, and thus it is possible to more appropriately capture an imaging surface of each component in an inspection image to improve the inspection accuracy.

In the inspection device of the present disclosure, the setting section may be configured to divide one board into multiple regions, and to set the reference position according to the setting method different for each region based on height information of the component disposed in each divided region. With this configuration, even in a case where the tendency of the height of a component differs for each region of the board, an appropriate reference position can be set for each region, and thus it is possible to more appropriately capture an imaging surface of each component in an inspection image to improve the inspection accuracy.

In the inspection device of the present disclosure, in a case where at least one of the multiple components scheduled to be disposed on the board is not disposed after height information of the multiple components scheduled to be disposed on the board is acquired and the reference position is set in advance, the setting section may reset the reference position in accordance with heights of other components except for the at least one component. With this configuration, an inspection image can be promptly started to be captured by setting the reference position in advance. In a case where some of the components are not disposed, the reference position is reset, and thus it is possible to more appropriately capture imaging surfaces of other components in inspection images to improve the inspection accuracy.

A method for capturing an inspection image according to the present disclosure is a method for capturing an inspection image of a board on which multiple components are disposed with a fixed focus type camera, the method including (a) a step of acquiring height information of the multiple components, and setting a reference position separated from a top surface of the board by a distance corresponding to a height of each of the components according to a predetermined setting method such that an imaging surface of each component within an imaging range of the camera is included in a depth of field of the camera; and (b) a step of moving the camera up or down relative to the board such that the camera focuses on the reference position, and then capturing the inspection image.

In the method for capturing an inspection image according to the present disclosure, in the same manner as in the inspection device described above, since an imaging surface of each component within an imaging range of the camera can be captured in a single inspection image, it is possible to quickly capture the inspection image. In the method for capturing an inspection image, various aspects of the inspection device may be employed, or steps for realizing each function of the inspection device may be added.

INDUSTRIAL APPLICABILITY

The present disclosure can be applied to a technical field for inspecting a board on which a component is disposed.

REFERENCE SIGNS LIST

10 Component mounting system, 12 LAN, 20 Mounting device, 40 Inspection device, 40a Base plate, 41 Inspection control unit, 42 CPU, 43 ROM, 44 RAM, 45 HDD, 50 Board processing unit, 52 Inspection process unit, 53 Board camera, 54 Moving mechanism, 54a Y-direction slider, 54b Z-direction slider, 55 Frame, 55a Beam, 56 Operation panel, 57 Display screen, 58 Operation button, 59 Input/output interface, 80 Management device, 81 Control device, 82 CPU, 83 ROM, 84 RAM, 85 HDD, 86 Mounting schedule information, 87 Input device, 88 Display, 89 Input/output interface, P Component, S Board

The invention claimed is:

1. An inspection device that performs inspection by using an inspection image of a board on which multiple components are disposed, the inspection device comprising:
   a fixed focus type camera;
   a lifting/lowering mechanism configured to move the camera up or down relative to the board;
   a setting section configured to
      acquire height information of the multiple components, the height information stored in a management device and based on mounting schedule information of the board, and
      set a reference position separated from a top surface of the board by a distance corresponding to heights of the components, acquired from the height information, according to a predetermined setting method such that an imaging surface of each component within an imaging range of the camera is included in a depth of field of the camera; and
   a control section configured to control the lifting/lowering mechanism and the camera such that the inspection image is captured after the camera is relatively moved up or down to focus on the reference position, wherein
   the setting section uses a method of setting the reference position with a most frequent value of the heights of the respective components as the distance,
   in a case where there are multiple most frequent values when using the method of setting the reference position by using the most frequent value as the predetermined setting method, the setting section sets multiple reference positions by using each of the multiple most frequent values, and
   the control section controls the lifting/lowering mechanism and the camera such that the inspection image is captured at each of the multiple reference positions.

2. The inspection device according to claim 1, wherein the setting section is configured to divide one board into multiple regions, and to set the reference position according to the predetermined setting method different for each region based on the height information of the components disposed in each divided region.

3. The inspection device according to claim 1, wherein the setting section determines a histogram of the heights in a region of the board and determines at least one of a most frequent value, a midpoint value, a median value, and an average value as a representative value of the heights in the region.

4. An inspection device that performs inspection by using an inspection image of a board on which multiple components are disposed, the inspection device comprising:
   a fixed focus type camera;
   a lifting/lowering mechanism configured to move the camera up or down relative to the board;
   a setting section configured to acquire height information of the multiple components, and set a reference position separated from a top surface of the board by a distance corresponding to a height of each of the components according to a predetermined setting method such that an imaging surface of each component within an imaging range of the camera is included in a depth of field of the camera; and
   a control section configured to control the lifting/lowering mechanism and the camera such that the inspection image is captured after the camera is relatively moved up or down to focus on the reference position, wherein
   in a case where some of the multiple components scheduled to be disposed on the board is not disposed after height information of the multiple components scheduled to be disposed on the board is acquired and the reference position is set in advance, the setting section resets the reference position in accordance with heights of other components except for some components.

5. The inspection device according to claim 4, wherein the setting section uses, as the predetermined setting method, any of a method of setting the reference position with an average value of the heights of the respective components as the distance, a method of setting the reference position with a median value of the heights of the respective components as the distance, a method of setting the reference position with a midpoint value of the heights of the respective components as the distance, and a method of setting the reference position with a most frequent value of the heights of the respective components as the distance.

6. A method for capturing an inspection image of a board on which multiple components are disposed with a fixed focus type camera, the method comprising:

acquiring height information of the multiple components, the height information stored in a management device and based on mounting schedule information of the board;

setting a reference position separated from a top surface of the board by a distance corresponding to a height of each of the components, acquired from the height information, according to a predetermined setting method such that an imaging surface of each component within an imaging range of the camera is included in a depth of field of the camera the predetermined setting method using a most frequent value of the heights of the respective components as the distance, and in a case where there are multiple most frequent values when using the method of setting the reference position by using the most frequent value as the predetermined setting method, multiple reference positions are set by using each of the multiple most frequent values;

moving the camera up or down relative to the board such that the camera focuses on the reference position, and then capturing the inspection image; and controlling the camera such that the inspection image is captured at each of the multiple reference positions.

* * * * *